United States Patent
Toepfer et al.

(10) Patent No.: US 12,105,427 B2
(45) Date of Patent: Oct. 1, 2024

(54) METHOD AND DEVICE FOR CORRECTING A TELECENTRICITY ERROR OF AN IMAGING DEVICE

(71) Applicant: Carl Zeiss SMT GmbH, Oberkochen (DE)

(72) Inventors: Susanne Toepfer, Gleina-Baumersroda (DE); Jochen Hetzler, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 17/884,891

(22) Filed: Aug. 10, 2022

(65) Prior Publication Data
US 2023/0050291 A1 Feb. 16, 2023

(30) Foreign Application Priority Data
Aug. 11, 2021 (DE) .......................... 102021120952.8

(51) Int. Cl.
G03F 7/00 (2006.01)
(52) U.S. Cl.
CPC .......... G03F 7/70191 (2013.01); G03F 7/702 (2013.01)
(58) Field of Classification Search
CPC . G01M 11/02; G02B 5/20; G03F 1/84; G03F 7/70191; G03F 7/702
See application file for complete search history.

(56) References Cited

U.S. PATENT DOCUMENTS

| | | | | |
|---|---|---|---|---|
| 5,734,478 A * | 3/1998 | Magome | ............... | G03F 9/7049 |
| | | | | 250/548 |
| 9,235,133 B2 * | 1/2016 | Tanaka | ................ | G03F 7/70191 |
| 2001/0012101 A1 * | 8/2001 | Mulkens | ............. | G03F 7/70066 |
| | | | | 355/71 |
| 2001/0055103 A1 * | 12/2001 | Nishi | .................. | G03F 7/70358 |
| | | | | 250/548 |
| 2006/0170895 A1 * | 8/2006 | Fiolka | ................. | G03F 7/70566 |
| | | | | 355/53 |

(Continued)

FOREIGN PATENT DOCUMENTS

| | | | | |
|---|---|---|---|---|
| DE | 102004063314 | | 7/2006 | |
| EP | 1521067 A2 * | | 4/2005 | ......... G02B 17/0663 |

OTHER PUBLICATIONS

The Office Action issued by the German Patent Office for Application No. DE 102021120952.8, dated Jan. 25, 2022 (with English Translation).

(Continued)

*Primary Examiner* — Deoram Persaud
(74) *Attorney, Agent, or Firm* — Fish & Richardson P.C.

(57) ABSTRACT

The invention relates to a method for correcting a telecentricity error of an imaging device for semiconductor lithography having an illumination unit, an imaging optical unit, and a filter for correcting the telecentricity error, having the following method steps:
  determining the telecentricity error of the imaging device,
  designing a filter for correcting the telecentricity error,
  arranging the filter in the pupil plane of the illumination unit,
  determining the telecentricity error again, and
  repeating the method steps one to four until the telecentricity error falls below a specified telecentricity error.
The invention furthermore relates to an imaging device for semiconductor lithography, which is configured for carrying out the method.

25 Claims, 3 Drawing Sheets

(56) References Cited

U.S. PATENT DOCUMENTS

| | | | |
|---|---|---|---|
| 2007/0058274 A1* | 3/2007 | Singer | G03F 7/70233 |
| | | | 359/857 |
| 2007/0103665 A1* | 5/2007 | Zimmerman | G03F 7/70125 |
| | | | 355/68 |
| 2008/0113281 A1 | 5/2008 | Maul et al. | |
| 2008/0291422 A1 | 11/2008 | Kremer | |
| 2009/0053618 A1* | 2/2009 | Goehnermeier | G03F 7/701 |
| | | | 430/5 |
| 2009/0323043 A1* | 12/2009 | Dieckmann | G03F 7/70191 |
| | | | 355/71 |
| 2015/0042974 A1* | 2/2015 | Zimmermann | G03F 7/70125 |
| | | | 355/71 |

OTHER PUBLICATIONS

Kidger, *Fundamental Optical Design*, SPIE Press, Bellingham, Washington, USA, pp. 7, 17-18 and 25-27 (2000).

\* cited by examiner

METHOD AND DEVICE FOR CORRECTING A TELECENTRICITY ERROR OF AN IMAGING DEVICE

CROSS-REFERENCE TO RELATED APPLICATIONS

The present application claims priority from German patent application DE 10 2021 120 952.8, filed on Aug. 11, 2021, the content of which is fully incorporated herein by reference.

TECHNICAL FIELD

The invention relates to a method and to a device for correcting a telecentricity error, in particular a mask inspection microscope for semiconductor lithography.

BACKGROUND

Photolithographic masks are used in lithography systems or for producing microstructured components, such as integrated circuits or LCDs (liquid crystal displays). In a lithography process or a microlithography process, an illumination unit illuminates a photolithographic mask, which is also referred to as photomask or simply mask. The light passing through the mask or the light reflected by the mask is projected, by a projection optical unit onto a substrate (e.g. a wafer) which is coated with a light-sensitive layer (photoresist) and arranged in the image plane of the projection optical unit in order to transfer the structure elements of the mask to the light-sensitive coating of the substrate and to thereby produce a desired structure on the substrate.

The positioning of structure elements on the surface of masks must be highly accurate, such that the deviations from the predetermined positions thereof or deviations from a critical dimension (CD) of a structure element lie in the nanometer range so as not to lead to errors on wafers during the exposure with the corresponding mask. The production of photomasks which can meet these requirements is extremely complex, susceptible to errors, and hence expensive. Therefore, masks must be repaired whenever possible.

SUMMARY

An important precondition for repairing defective masks is the finding and characterization of defects which are present, in particular of positioning defects or positioning errors ("registration errors" or simply "registration"). The detection of positioning defects and/or deviations of the CD is complicated and difficult as these dimensions need to be established with an accuracy in the single-digit nanometer range, preferably in the sub-nanometer range.

Use is made of mask inspection microscopes or position determination devices with incident light illumination and transmitted light illumination in order to examine positioning errors and/or the CD value. The masks are initially positioned in the focus of the imaging optical unit of the mask inspection microscope. One type of focusing known from the prior art is based on the fact that a region around the expected focus, which is also referred to as defocus region, is measured with a plurality of individual images, what is known as focus stagger, in the imaging direction (z-axis). From the individual images, the sharpest image, that is to say the image having the greatest contrast, is determined, from which the position of the focus with respect to the imaging optical unit can be determined. If the imaging optical unit and/or the illumination has a telecentricity error (tel), the latter causes the position of the structure to migrate perpendicular to the z-axis over the defocus z, which results in a contribution ($F_{x,y}$) to the positioning error, which is calculated as follows:

$$F_{xy} = \text{tel} * z$$

An error (dz) during the determination of the best focus leads, together with the telecentricity error, to a measurement error ($Mf_{dx,dy}$) of the position of the structure:

$$Mf_{dx,dy} = \text{tel} * dz$$

In a fast measurement method, which is important to the user, rather than the focus stagger, which typically comprises 5 to 7 images, only one image is recorded in the plane that is determined by the autofocus and does not necessarily have to be the best focus and can result in focus errors dz of 100 nm. This focus error produces with a telecentricity error of 5 mrad an acceptable contribution to the positioning error of 0.5 nm. However, due to manufacturing and adjustment tolerances and due to a refractive index of the coating dependent on the angle of incidence of the illumination beam, the telecentricity error is frequently more than 20 mrad, as a result of which the contribution to the positioning error with 2 nm can no longer be tolerated. There is no known possibility for setting the telecentricity error of the system, that is to say the direction of the centroid ray, independently of other parameters relevant for the imaging quality. The centroid ray is the imaging ray in a light beam that uses the imaging optical unit to transform an object point in the object plane to an image point in an image field plane which in a plane perpendicular to its propagation direction runs through the energy-weighted centroid that is obtained by integrating the light intensities of said light beam in this plane.

It is an aspect of the present invention to provide a method which eliminates the above-described disadvantages of the prior art. It is a further aspect of the invention to specify a device for setting the telecentricity and a mask inspection microscope having such a device.

This aspect is achieved by use of a device and a method having the features of the independent claims. The dependent claims relate to advantageous developments and variants of the invention.

A method according to the invention for correcting a telecentricity error of an imaging device for semiconductor lithography comprises the following method steps:
- determining the telecentricity error of the imaging device,
- designing a filter for correcting the telecentricity error,
- arranging the filter in the pupil plane of an illumination unit of the imaging device,
- determining the telecentricity error again, and
- repeating the method steps one to four until the telecentricity error falls below a specified telecentricity error.

The telecentricity error can here be determined on the basis of a lateral intensity distribution in the pupil of the imaging optical unit (9). For the event that the imaging device is in the form of a mask inspection microscope, the intensity distribution in the pupil of the imaging optical unit can be easily captured and determined. For this purpose, an optical assembly known as a Bertrand lens can be used, which is frequently mounted in such devices and can be pivoted into the beam path of the measurement light for this purpose. Owing to manufacturing errors and layer tolerances, the intensity distribution in the pupil is frequently asymmetric and drops from the optical axis laterally to the edge of the pupil. This edge drop-off, as it is known, primarily has a square radial profile, but can also have other, higher-order radial profiles. The edge drop-off which has been ascertained in this manner can be taken into account in the production of the filter, so that it can be compensated by the filter.

In addition, the filter can comprise a laterally varying transmission profile. The latter can correct the intensity distribution by transmission of varying strength in a manner such that the telecentricity error can be reduced to a minimum. In particular, the filter can bring about an increasing or decreasing attenuation of the illumination light via the radius. The filters can be produced here for example from a quartz plate with a chromium layer or dielectric layer of varying thickness. This results in a change in the intensity distribution in the pupil of the imaging optical unit and can be used to reduce the telecentricity error.

In particular, the transmission of the filter can have a radial-symmetric profile. This profile can correct the edge drop-off which is typically present in imaging devices and is likewise radial-symmetric. In particular, the radial-symmetric profile of the transmission can run from the center of the filter to the edge. The transmission at the edge can be, for example, close to 100% and lie in a range between 40% and 80%, for example, at the center of the filter. The profile and the minimum transmission at the center of the filter are mainly dependent on the extent and the profile of the edge drop-off. In the ideal case, the edge drop-off after the filter has been inserted is zero, with the goal being a reduction to a drop in the intensity of less than 10%.

In an advantageous variant of the invention, the selection of the filter can be based on the lateral intensity distribution. The filter can thus be redesigned for each individual imaging device, such as for example a mask inspection microscope. Depending on the deviations between the individual imaging devices of a device type, various scenarios are conceivable. The individual imaging devices can be corrected with a filter that is produced individually for the device after the lateral intensity distribution has been determined. Alternatively, the filter can be selected after the determination of the lateral intensity distribution from a gradation of pre-fabricated filters, which is of interest in particular if the imaging device is mounted only at a user's location and the lateral intensity distribution can be determined after start-up and capturing of the pupil of the imaging device with the aid of a Bertrand lens and a camera. If the deviations between the individual devices are very small, a filter with a transmission profile for correcting the telecentricity may also suffice.

Furthermore, the selection of the filter can be based on a pupil apodization of the imaging optical unit. In particular in the case of mask inspection microscopes having a large aperture, apodization frequently occurs, that is to say a shading of the edges of the pupil, which can at least be partially compensated by a suitable selection of the transmission profile of the filter.

In a further embodiment of the invention, the centroid ray of the intensity distribution can be determined. As described further above, this centroid ray can be displaced out of the optical axis due to the asymmetric distribution of the intensity and can additionally have a direction that is not parallel to the optical axis of the imaging system. The optical axis is the axis of symmetry of a rotation-symmetric optical system, wherein it is the symmetry of the surfaces rather than the symmetry of the border that is critical. Deformations and displacements of optical elements and deviations of the centroid ray are typically in reference to the optical axis.

In particular, the filter can be arranged in the pupil plane of the illumination unit on the basis of the determination of the centroid ray. The filter is here arranged such that the regions with low transmission lie on or near the centroid ray and a displacement of the centroid ray can be brought about due to the transmission increasing from the center to the border of the filter. In the event that the illumination unit comprises an illumination aperture stop, the filter is positioned as closely as possible to the pupil plane.

In addition, the filter in the pupil plane can be manipulated. In this case, the holder is arranged for example in a retainer, which in turn is connected to a manipulator that makes possible a movement of the filter in the filter plane.

In particular, the manipulation can be manual and/or be effected by a drive. Manual manipulation can take place for example using setting screws.

Alternatively or additionally, manual manipulation can be effected using spacers. In this context, spacers are understood to mean washers or shims having a specific thickness, which make it possible to vary the position of a component, for example a retainer of a filter, without changing the connecting point between the retainer and a receptacle. The filter can initially be mounted with nominal spacers having a predetermined thickness. After the filter has been mounted, the intensity distribution in the imaging pupil is determined and a target position of the filter is determined based on the intensity distribution. Based on this new target position, the thicknesses of the new spacers are determined and the nominal spacers are replaced by the new ones. To make sure, the intensity distribution in the imaging pupil can then be determined again.

In an advantageous variant of the invention, the filter can be positioned such that the pupil open frame and the pupil in a pinhole object match, so that the variation of the telecentricity over the different mark structures is minimized.

The method according to the invention can be performed with incident light illumination and/or with transmitted light illumination. To this end, a filter can be arranged in each of the two illumination optical units for the incident light illumination and the transmitted light illumination.

An imaging device according to the invention for semiconductor lithography having an illumination unit, an imaging optical unit, and a filter for correcting a telecentricity error is characterized in that the filter is arranged in a pupil plane of the illumination unit. In this context, the filter should then also be considered to be arranged in the pupil plane if the absolute value of the associated paraxial subaperture ratio is greater than 0.8.

The paraxial subaperture ratio is given by $$\frac{r}{|h| + |r|} \operatorname{sgn} h,$$

where r denotes the paraxial marginal ray height, h denotes the paraxial chief ray height, and the signum function sgn x denotes the sign of x, with sgn 0=1 according to convention. A definition of the paraxial marginal ray or paraxial chief ray can be found in "Fundamental Optical Design" by Michael J. Kidger, SPIE PRESS, Bellingham, Washington, USA, which is incorporated herein by reference.

The paraxial subaperture ratio is a signed variable which is a measure of the field or pupil proximity to a plane in the beam path. Per definition, the subaperture ratio is normalized to values of between −1 and 1, wherein a zero of the paraxial subaperture ratio corresponds to each field plane, and wherein a discontinuity with a jump in the paraxial subaperture ratio from −1 to +1 or from +1 to −1 corresponds to each pupil plane. Accordingly, paraxial subaperture ratios of zero for the present application denote field planes, while an absolute value of a paraxial subaperture ratio of 1 determines a pupil plane. Therefore, near-field planes have paraxial subaperture ratios lying close to 0, while near-pupil planes have paraxial subaperture ratios lying close to 1 in terms of absolute value. The sign of the paraxial subaperture ratio specifies the location of the plane in front of or behind a reference plane. For definition purposes, for example the sign of the intersection point of a coma ray in the relevant surface can be used.

Two planes in the beam path are said to be conjugate if they have the same paraxial subaperture ratio. Pupil planes are conjugated to one another, as are field planes.

In particular, the filter can be embodied as a transmission filter. The latter can be designed here such that the intensity in the pupil is homogenized, that is to say regions having a higher intensity are shaded and regions having a lower intensity are not shaded.

In a variant of the invention, the filter is in the form of a radial-symmetric transmission filter. It corrects the edge drop-off, that is to say an intensity distribution dropping in the direction of the edge of the pupil, caused in most systems by manufacturing tolerances and layer thickness variations. Moreover, it is also possible to correct the apodization occurring in particular in imaging systems having a large aperture.

Furthermore, the filter can be designed such that it can be positioned in the filter plane. In this way, the filter with its optical axis, as the axis of symmetry of the radial-symmetric filter, can be displaced out of the optical axis of the illumination unit and the filter can be positioned such that the centroid ray lies on the optical axis.

In particular, the filter can be positioned by a manipulator. The latter can be connected to a controller which, based on the evaluation of the captured pupil of the imaging system and the filter profile stored in the controller, can determine the position of the filter and control the manipulator such that it positions the filter at the predetermined position. Alternatively, the filter can also be brought to the predetermined position by a manual manipulator, such as setting screws. In principle it is also conceivable to set the position of the filter by adapting spacers, that is to say washers or shims having specific thicknesses. Due to the relatively great complexity and the fact that the systems are ultimately mainly only set up at the user's location, this makes sense only if the filter is determined and manufactured only after setup and individually for the imaging system. The positioning of the filter in the filter plane, as described further above, can take place by a decentered arrangement of the transmission profile on the filter, with the result that the filter can be mounted at a fixed abutment which was previously adjusted in comparison with the optical axis.

The imaging device may be in particular in the form of a mask inspection microscope.

BRIEF DESCRIPTION OF DRAWINGS

Exemplary embodiments and variants of the invention are explained in more detail below with reference to the drawing, in which.

DETAILED DESCRIPTION

Figure 1:
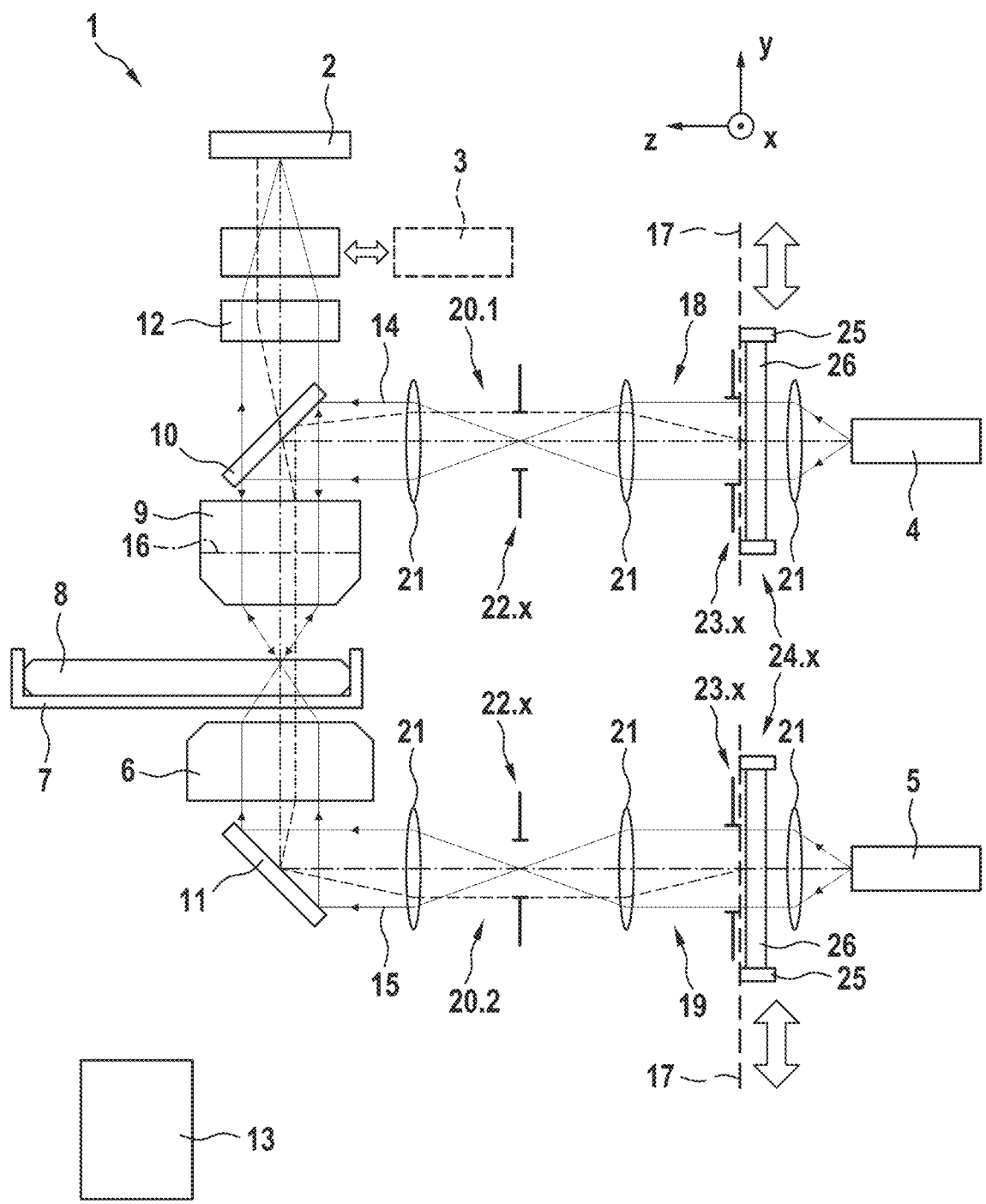
FIG. 1 shows a schematic illustration of a mask inspection microscope in which the invention can be used.

FIG. 1 shows a schematic illustration of an imaging device, in the form of a mask inspection microscope 1, for measuring an object 8, which can be embodied as a photomask, for example. The mask inspection microscope 1 comprises two light sources 4, 5, wherein a first light source 4 is configured for a measurement of the object 8 in reflection and a second light source 5 is configured for a measurement of the object 8 in transmitted light. The object 8 is arranged on an object stage 7, which can position the object 8 laterally and vertically in the sub-micrometer range. In this case, the positional accuracy can be in particular in a range of less than 100 nm, in particular less than 20 nm. During a transmitted light measurement, the measurement light 15 of the illumination unit 19, which comprises the light source 5, a beam-shaping optical unit 20.2, a mirror 11, and an illumination optical unit embodied as a condenser 6, passes through the beam-shaping optical unit 20.2, is reflected by the mirror 11, and then passes through the condenser 6, which generates a desired light distribution on the object 8. The pupil plane of the beam-shaping optical unit 20.2 is denoted by the reference sign 17 in the figure. The measurement light 15 passes further through the object 8, which is subsequently imaged by an imaging optical unit 9 and a tube optical unit 12. The tube optical unit 12 magnifies the imaging of the object 8 and images it in turn on a recording device 2 embodied as a CCD camera. The semi-transmissive mirror 10 arranged between the imaging optical unit 9 and the tube optical unit 12 is used for the measurement in reflection and has no influence on the measurement in transmitted light.

During a measurement in reflection, the measurement light 14 that is emitted by the light source 4 of the illumination unit 18 and shaped by the beam-shaping optical unit 20.1 is reflected at the semi-transmissive mirror 10 and is then incident on the imaging optical unit 9. The latter focuses the measurement light 14 on the object 8, from which it is reflected. The measurement light 14 passes once more through the imaging optical unit 9 and the latter images the object 8 through the semi-transmissive mirror 10 on the tube optical unit 12. The tube optical unit 12 magnifies the imaging of the object 8 and images it on the recording device 2.

The beam-shaping optical unit 20.x comprises a few optical elements 21, a telecentricity manipulator 24.x, an aperture stop 23.x, and a field stop 22.x. The measurement light 14, 15 emitted by the light source 4, 5 initially passes through one or more optical elements 21 and in the pupil plane 17 of the beam-shipping optical unit 20.x or in the vicinity thereof is incident on a filter 26, which is arranged in a retainer 25 in the telecentricity manipulator 24. The filter 26 can be moved by the manipulator 24 in the filter plane, which corresponds to the x,y-plane, that is to say perpendicular to the direction of the measurement light 14, 15 denoted as the z-direction, which is indicated in the figure by way of a double-headed arrow. The measurement light 14, 15 then passes through the aperture stop 23.x, further optical elements 21, and the field stop 22.x, before it is incident on the semi-transmissive mirror 10 or the mirror 11.

For characterizing the imaging functions of the overall system of the illumination unit 18 and 19 and the imaging optical unit 9, an additional optical module 3, such as, for example, in the form of what is known as a Bertrand lens 3 containing a Fresnel zone plate, can optionally be pivoted into the beam path of the mask inspection microscope 1 between the recording device 2 and the tube optical unit 12. This has the effect that what is imaged onto the recording device 2 is no longer the object 8, but rather the pupil 16 of the imaging optical unit 9. The pupil 16 comprises the influences of all the optical components participating in the imaging, that is to say in particular the condenser 6 and/or the imaging optical unit 9, and the intensity distribution of the measurement light 14, 15 provided by the illumination unit 18 or 19. It can be used to determine from the captured intensity distribution the telecentricity error of the mask inspection microscope 1 with the aid of a computation unit 13. Although the main contribution of the telecentricity error is typically caused by the layers in the imaging optical unit 9, and only a smaller contribution is made by manufacturing and mounting tolerances of the imaging optical unit 9 and the illumination unit 18, 19, the telecentricity error can be corrected by a filter 26 arranged in the illumination unit 18, 19.

The mode of operation of the filter for correcting the telecentricity error and a possible procedure for adjusting the filter will be described with reference to FIGS. 2A to 2E.

Figure 2A:
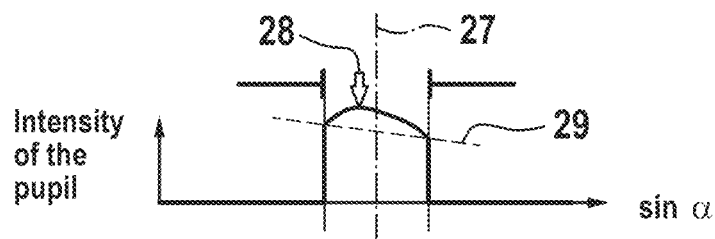
FIGS. 2A to 2E show illustrations relating to the mode of operation of the filter for correcting the telecentricity error.

FIG. 2A shows a diagram which plots the intensity of the pupil captured, as explained further above, with the aid of the Bertrand lens over the aperture, wherein the pupil is delimited by a schematically illustrated aperture stop. The intensity distribution in the example shown has a square profile with an intensity that drops toward the edge, which corresponds to a typical profile with edge drop-off, as it is known, which is caused by manufacturing tolerances and layer thickness variations. Due to the centroid ray 28 that has been displaced out of the optical axis 28, that is to say the ray running through the energy-weighted centroid of the imaging light beam, the base plane 29, that is to say the plane spanned by the intensity values of the marginal rays, is additionally tilted with respect to a plane extending perpendicularly to the optical axis 27.

Figure 2B:
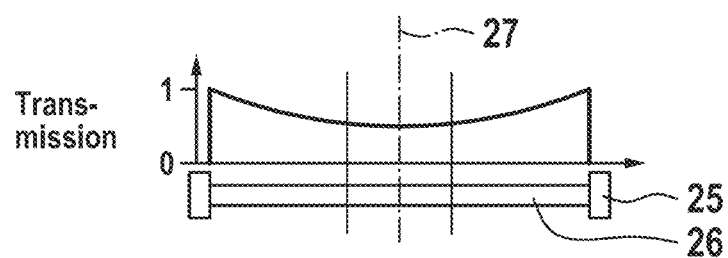

FIG. 2B shows a schematically illustrated filter 26 in a retainer 25, above which the transmission profile thereof is illustrated. The latter was determined by a computation unit based on the intensity distribution illustrated in FIG. 2A. The transmission profile is rotation-symmetric and has a square profile in the example shown according to the intensity distribution, wherein the transmission at the edge corresponds to nearly 100% and has its minimum $T_{min}$ according to the intensity distribution at the center, wherein $T_{min}$ typically lies in a range between 40% and 80%. The position of the filter 26 corresponds to the arrangement of the filter in the illumination unit after initial mounting, in which the location of the lowest transmission is positioned on the optical axis of the illumination unit. In addition to the square profile of the transmission illustrated in this exemplary embodiment, the filters can also have higher-order profiles. Also conceivable is a transmission profile of any desired shape, which can be produced for example based on a pupil measured in the system and can thus lead to a maximum correction of the telecentricity error.

Figure 2C:
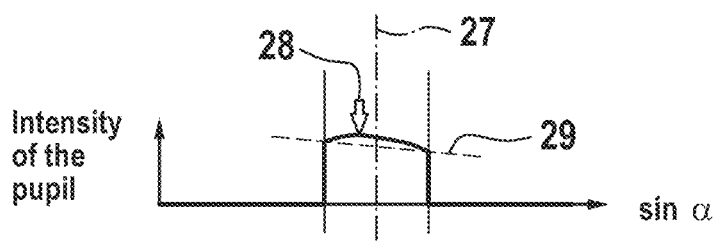

FIG. 2C illustrates the intensity distribution after the central positioning of the filter 26 with an edge drop-off that is reduced due to the filter 26. The alignment of the base plane 29 and the centroid ray 28 are not influenced due to the symmetry of the transmission filter.

Figure 2D:
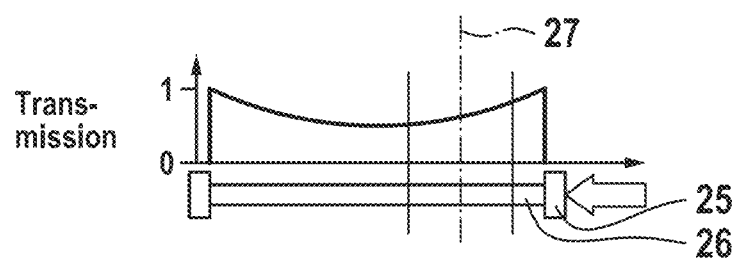

FIG. 2D shows, as before in FIG. 2B, a schematically illustrated filter 26 in its retainer 25, above which the transmission profile thereof is illustrated. In the figure, the filter 26 is displaced with respect to the optical axis 27 in the direction of the centroid ray 28 (not to scale), which is indicated in the figure by way of an arrow. This corresponds to the position of the filter 26 after the positioning, for example by a telecentricity manipulator in the pupil plane of the illumination unit in the mask inspection microscope.

Figure 2E:
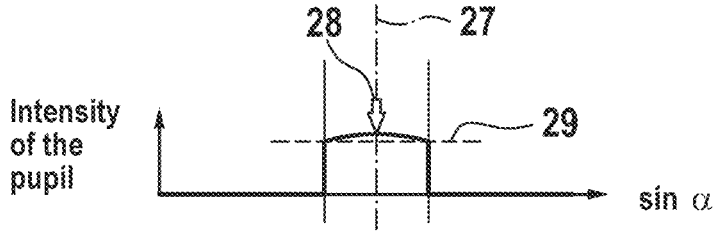

The filter 26 is decentered out of the optical axis 27 until, as is illustrated in FIG. 2E, the centroid ray 28 lies on the optical axis 27 and the base plane 29 lies on a plane perpendicular to the optical axis 27, as a result of which the telecentricity error is corrected.

Figure 3:
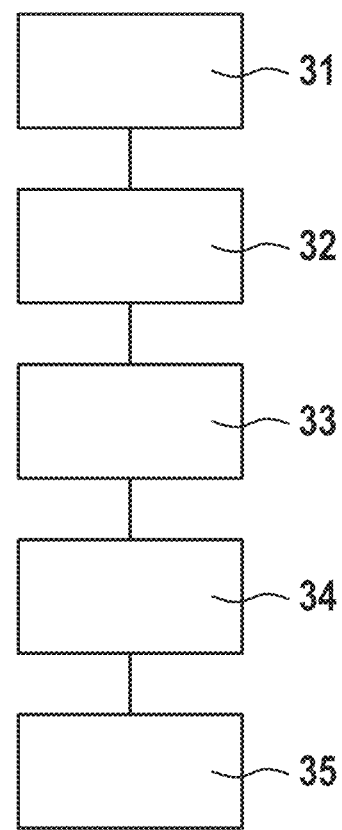
FIG. 3 shows a flowchart for a correction method according to the invention.

FIG. 3 shows a flowchart of a method for correcting a telecentricity error of an imaging device for semiconductor lithography having an illumination unit, an imaging optical unit, and a filter for correcting the telecentricity error.

The telecentricity error of the imaging device is determined in a first method step 31.

A filter is designed for correcting the telecentricity error in a second method step 32.

The filter is arranged in the pupil plane of the illumination unit in a third method step 33.

The telecentricity error of the imaging device is determined in a fourth method step 34.

The method steps 1 to 4 are repeated in a fifth method step 35 until the telecentricity error falls below a specified telecentricity error.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

LIST OF REFERENCE SIGNS

1 Mask inspection microscope
2 CCD camera, recording device
3 Bertrand lens
4 Light source for reflection
5 Light source for transmitted light
6 Condenser
7 Object stage
8 Object
9 Imaging optical unit
10 Semi-transmissive mirror
11 Mirror
12 Tube optical unit
13 Computation unit
14 Measurement light in reflection
15 Measurement light in transmitted light
16 Pupil of imaging optical unit
17 Pupil of condenser
18 Illumination unit in reflection
19 Illumination unit in transmitted light
20.1, 20.2 Beam-shaping optical unit
21 Optical elements, lenses
22.1, 22.2 Field stop
23.1, 23.2 Aperture stop
24.1, 24.2 Telecentricity manipulator
25 Retainer of filter
26 Filter
27 Optical axis
28 Centroid ray
29 Base plane
31 Method step 32 Method step
33 Method step
34 Method step
35 Method step
Tmin Location of minimum transmission

What is claimed is:

1. A method for correcting a telecentricity error of an imaging device for semiconductor lithography having an illumination unit, an imaging optical unit, and a filter for correcting the telecentricity error, having the following method steps:
 determining the telecentricity error of the imaging device,
 designing a filter for correcting the telecentricity error,
 arranging the filter for correcting the telecentricity error in the pupil plane of the illumination unit,
 determining the telecentricity error again, and
 repeating the method steps one to four until the telecentricity error falls below a specified telecentricity error,
 wherein the telecentricity error is determined on the basis of a lateral intensity distribution in the pupil of the imaging optical unit, and
 wherein the centroid ray of the intensity distribution is determined.

2. The method of claim 1,
 wherein the filter has a laterally varying transmission profile.

3. The method of claim 2,
 wherein the transmission of the filter has a radial-symmetric profile.

4. The method of claim 1,
 wherein the selection of the filter is based on the lateral intensity distribution.

5. The method of claim 1,
 wherein the selection of the filter is based on a pupil apodization of the imaging optical unit.

6. The method of claim 1,
 wherein the filter is arranged in the pupil plane of the illumination unit on the basis of the determination of the centroid ray.

7. The method of claim 6,
 wherein the filter in the pupil plane can be manipulated.

8. The method of claim 7,
 wherein the manipulation is manual and/or is effected by a drive.

9. The method of claim 8,
 wherein the manual manipulation takes place with the aid of spacers.

10. The method of claim 1,
 wherein the filter is positioned such that the pupil open frame and the pupil in a pinhole object match.

11. The method of claim 1,
 wherein the method is performed with incident light illumination and/or with transmitted light illumination.

12. The method of claim 1, comprising:
 providing an optical module that is movable between a first position and a second position;
 providing a recording device configured to at least one of record an image of an object in an image plane or record an image of a pupil in a pupil plane of the imaging optical unit;
 moving the optical module to the first position and recording the image of the pupil in the pupil plane of the imaging optical unit;
 determining the lateral intensity distribution in the pupil of the imaging optical unit based on the image of the pupil recorded by the recording device; and
 moving the optical module to the second position, and recording the image of the object in the image plane.

13. The method of claim 12 wherein providing the optical module comprises providing a Bertrand lens containing a Fresnel zone plate.

14. An imaging device for semiconductor lithography having an illumination unit, an imaging optical unit, and a filter for correcting a telecentricity error,
 wherein the filter for correcting the telecentricity error is arranged in a pupil plane of the illumination unit.

15. The imaging device of claim 14,
 wherein the filter is in the form of a transmission filter.

16. The imaging device of claim 14,
 wherein the imaging device is in the form of a mask inspection microscope.

17. The imaging device of claim 15,
 wherein the filter is in the form of a radial-symmetric transmission filter.

18. The imaging device of claim 15,
 wherein the filter is designed such that it can be positioned in the filter plane.

19. The imaging device of claim 15,
 wherein the imaging device is in the form of a mask inspection microscope.

20. The imaging device of claim 14,
 wherein the filter is in the form of a radial-symmetric transmission filter.

21. The imaging device of claim 14,
 wherein the filter is designed such that it can be positioned in the filter plane.

22. The imaging device of claim 21,
 wherein the filter can be positioned by a manipulator.

23. The imaging device of claim 14, comprising a sensor configured to record an image of a pupil in a pupil plane of an imaging optical unit, the image having information about a lateral intensity distribution in the pupil.

24. The imaging device of claim 23, comprising:
 an optical module that is movable between a first position and a second position; and
 a recording device configured to at least one of record an image of an object in an image plane or record an image of a pupil in the pupil plane of the imaging optical unit;
 wherein when the optical module is moved to the first position, the recording device is configured to record the image of the pupil in the pupil plane of the imaging optical unit, the image having information about a lateral intensity distribution in the pupil; and
 wherein when the optical module is moved to the second position, the recording device is configured to record the image of the object in the image plane.

25. The imaging device of claim 24, comprising a computation unit configured to determine the telecentricity error on the basis of the lateral intensity distribution in the pupil of the imaging optical unit.

* * * * *